(12) United States Patent
Chaji

(10) Patent No.: US 10,170,522 B2
(45) Date of Patent: Jan. 1, 2019

(54) HIGH PIXEL DENSITY ARRAY ARCHITECTURE

(71) Applicant: Ignis Innovation Inc., Waterloo (CA)

(72) Inventor: Gholamreza Chaji, Waterloo (CA)

(73) Assignee: Ignis Innovations Inc., Waterloo (CA)

( * ) Notice: Subject to any disclaimer, the term of this patent is extended or adjusted under 35 U.S.C. 154(b) by 0 days.

(21) Appl. No.: 15/811,206

(22) Filed: Nov. 13, 2017

(65) Prior Publication Data

US 2018/0069058 A1 Mar. 8, 2018

Related U.S. Application Data

(63) Continuation of application No. 14/953,527, filed on Nov. 30, 2015, now Pat. No. 9,842,889.

(30) Foreign Application Priority Data

Nov. 28, 2014 (CA) ...................................... 2872563

(51) Int. Cl.
*H01L 27/32* (2006.01)
*H01L 51/56* (2006.01)
*G09G 3/36* (2006.01)

(52) U.S. Cl.
CPC ....... *H01L 27/3218* (2013.01); *G09G 3/3607* (2013.01); *H01L 27/3213* (2013.01); *H01L 51/56* (2013.01)

(58) Field of Classification Search
CPC .............. G09G 3/3607; H01L 27/3213; H01L 27/3218
USPC ............................................ 257/40; 345/581
See application file for complete search history.

(56) References Cited

U.S. PATENT DOCUMENTS

| | | |
|---|---|---|
| 4,354,162 A | 10/1982 | Wright |
| 4,758,831 A | 7/1988 | Kasahara et al. |
| 4,963,860 A | 10/1990 | Stewart |
| 4,975,691 A | 12/1990 | Lee |
| 4,996,523 A | 2/1991 | Bell et al. |
| 5,051,739 A | 9/1991 | Hayashida et al. |
| 5,222,082 A | 6/1993 | Plus |
| 5,266,515 A | 11/1993 | Robb et al. |
| 5,498,880 A | 3/1996 | Lee et al. |
| 5,589,847 A | 12/1996 | Lewis |

(Continued)

FOREIGN PATENT DOCUMENTS

| | | |
|---|---|---|
| CA | 1294034 | 1/1992 |
| CA | 2109951 | 11/1992 |

(Continued)

OTHER PUBLICATIONS

Ahnood et al.: "Effect of threshold voltage instability on field effect mobility in thin film transistors deduced from constant current measurements"; dated Aug. 2009 (3 pages).

(Continued)

*Primary Examiner* — David Vu
*Assistant Examiner* — Brandon Fox
(74) *Attorney, Agent, or Firm* — Stratford Managers Corporation

(57) ABSTRACT

What is disclosed is a pixel array architecture for displays being based on a matrix of subpixels arranged in a rectilinear matrix oriented at an angle relative to a horizontal direction of the display, exhibiting a reduced pixel pitch for the subpixels.

20 Claims, 13 Drawing Sheets

(56) References Cited

U.S. PATENT DOCUMENTS

| | | |
|---|---|---|
| 5,619,033 A | 4/1997 | Weisfield |
| 5,648,276 A | 7/1997 | Hara et al. |
| 5,670,973 A | 9/1997 | Bassetti et al. |
| 5,684,365 A | 11/1997 | Tang et al. |
| 5,686,935 A | 11/1997 | Weisbrod |
| 5,712,653 A | 1/1998 | Katoh et al. |
| 5,714,968 A | 2/1998 | Ikeda |
| 5,747,928 A | 5/1998 | Shanks et al. |
| 5,748,160 A | 5/1998 | Shieh et al. |
| 5,784,042 A | 7/1998 | Ono et al. |
| 5,790,234 A | 8/1998 | Matsuyama |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,081,131 A | 6/2000 | Ishii |
| 6,091,203 A | 7/2000 | Kawashima et al. |
| 6,097,360 A | 8/2000 | Holloman |
| 6,144,222 A | 11/2000 | Ho |
| 6,157,583 A | 12/2000 | Starnes et al. |
| 6,166,489 A | 12/2000 | Thompson et al. |
| 6,177,915 B1 | 1/2001 | Beeteson et al. |
| 6,225,846 B1 | 5/2001 | Wada et al. |
| 6,229,508 B1 | 5/2001 | Kane |
| 6,232,939 B1 | 5/2001 | Saito et al. |
| 6,246,180 B1 | 6/2001 | Nishigaki |
| 6,252,248 B1 | 6/2001 | Sano et al. |
| 6,259,424 B1 | 7/2001 | Kurogane |
| 6,274,887 B1 | 8/2001 | Yamazaki et al. |
| 6,288,696 B1 | 9/2001 | Holloman |
| 6,300,928 B1 | 10/2001 | Kim |
| 6,303,963 B1 | 10/2001 | Ohtani et al. |
| 6,306,694 B1 | 10/2001 | Yamazaki et al. |
| 6,307,322 B1 | 10/2001 | Dawson et al. |
| 6,316,786 B1 | 11/2001 | Mueller et al. |
| 6,320,325 B1 | 11/2001 | Cok et al. |
| 6,323,631 B1 | 11/2001 | Juang |
| 6,323,832 B1 | 11/2001 | Nishizawa et al. |
| 6,345,085 B1 | 2/2002 | Yeo et al. |
| 6,348,835 B1 | 2/2002 | Sato et al. |
| 6,365,917 B1 | 4/2002 | Yamazaki |
| 6,373,453 B1 | 4/2002 | Yudasaka |
| 6,384,427 B1 | 5/2002 | Yamazaki et al. |
| 6,392,617 B1 | 5/2002 | Gleason |
| 6,399,988 B1 | 6/2002 | Yamazaki |
| 6,414,661 B1 | 7/2002 | Shen et al. |
| 6,420,758 B1 | 7/2002 | Nakajima |
| 6,420,834 B2 | 7/2002 | Yamazaki et al. |
| 6,420,988 B1 | 7/2002 | Azami et al. |
| 6,433,488 B1 | 8/2002 | Bu |
| 6,445,376 B2 | 9/2002 | Parrish |
| 6,468,638 B2 | 10/2002 | Jacobsen et al. |
| 6,489,952 B1 | 12/2002 | Tanaka et al. |
| 6,501,098 B2 | 12/2002 | Yamazaki |
| 6,501,466 B1 | 12/2002 | Yamagashi et al. |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,559,594 B2 | 5/2003 | Fukunaga et al. |
| 6,573,195 B1 | 6/2003 | Yamazaki et al. |
| 6,573,584 B1 | 6/2003 | Nagakari et al. |
| 6,576,926 B1 | 6/2003 | Yamazaki et al. |
| 6,577,302 B2 | 6/2003 | Hunter |
| 6,580,408 B1 | 6/2003 | Bae et al. |
| 6,580,657 B2 | 6/2003 | Sanford et al. |
| 6,583,775 B1 | 6/2003 | Sekiya et al. |
| 6,583,776 B2 | 6/2003 | Yamazaki et al. |
| 6,587,086 B1 | 7/2003 | Koyama |
| 6,593,691 B2 | 7/2003 | Nishi et al. |
| 6,594,606 B2 | 7/2003 | Everitt |
| 6,597,203 B2 | 7/2003 | Forbes |
| 6,611,108 B2 | 8/2003 | Kimura |
| 6,617,644 B1 | 9/2003 | Yamazaki et al. |
| 6,618,030 B2 | 9/2003 | Kane et al. |
| 6,641,933 B1 | 11/2003 | Yamazaki et al. |
| 6,661,180 B2 | 12/2003 | Koyama |
| 6,661,397 B2 | 12/2003 | Mikami et al. |
| 6,670,637 B2 | 12/2003 | Yamazaki et al. |
| 6,677,713 B1 | 1/2004 | Sung |
| 6,680,577 B1 | 1/2004 | Inukai et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,734,636 B2 | 5/2004 | Sanford et al. |
| 6,738,034 B2 | 5/2004 | Kaneko et al. |
| 6,738,035 B1 | 5/2004 | Fan |
| 6,771,028 B1 | 8/2004 | Winters |
| 6,777,712 B2 | 8/2004 | Sanford et al. |
| 6,780,687 B2 | 8/2004 | Nakajima et al. |
| 6,806,638 B2 | 10/2004 | Lih et al. |
| 6,806,857 B2 | 10/2004 | Sempel et al. |
| 6,809,706 B2 | 10/2004 | Shimoda |
| 6,859,193 B1 | 2/2005 | Yumoto |
| 6,861,670 B1 | 3/2005 | Ohtani et al. |
| 6,873,117 B2 | 3/2005 | Ishizuka |
| 6,873,320 B2 | 3/2005 | Nakamura |
| 6,878,968 B1 | 4/2005 | Ohnuma |
| 6,909,114 B1 | 6/2005 | Yamazaki |
| 6,909,419 B2 | 6/2005 | Zavracky et al. |
| 6,919,871 B2 | 7/2005 | Kwon |
| 6,937,215 B2 | 8/2005 | Lo |
| 6,940,214 B1 | 9/2005 | Komiya et al. |
| 6,943,500 B2 | 9/2005 | LeChevalier |
| 6,954,194 B2 | 10/2005 | Matsumoto et al. |
| 6,956,547 B2 | 10/2005 | Bae et al. |
| 6,995,510 B2 | 2/2006 | Murakami et al. |
| 6,995,519 B2 | 2/2006 | Arnold et al. |
| 7,022,556 B1 | 4/2006 | Adachi |
| 7,023,408 B2 | 4/2006 | Chen et al. |
| 7,027,015 B2 | 4/2006 | Booth, Jr. et al. |
| 7,034,793 B2 | 4/2006 | Sekiya et al. |
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,161,566 B2 | 1/2007 | Cok et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |
| 7,279,711 B1 | 10/2007 | Yamazaki et al. |
| 7,304,621 B2 | 12/2007 | Oomori et al. |
| 7,310,092 B2 | 12/2007 | Imamura |
| 7,315,295 B2 | 1/2008 | Kimura |
| 7,317,429 B2 | 1/2008 | Shirasaki et al. |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |
| 7,502,000 B2 | 3/2009 | Yuki et al. |

(56) References Cited

U.S. PATENT DOCUMENTS

| | | |
|---|---|---|
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,115,707 B2 | 2/2012 | Nathan et al. |
| 8,378,362 B2 | 2/2013 | Heo et al. |
| 8,421,820 B2 | 4/2013 | Brown Elliott et al. |
| 8,493,295 B2 | 7/2013 | Yamazaki et al. |
| 8,497,525 B2 | 7/2013 | Yamagata et al. |
| 9,256,064 B1 | 2/2016 | Sprague et al. |
| 9,812,512 B2 * | 11/2017 | Wang .................... H01L 27/12 |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kujik |
| 2001/0024186 A1 | 9/2001 | Kane |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kujik |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0167471 A1 | 11/2002 | Everitt |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0071804 A1 | 4/2003 | Yamazaki et al. |
| 2003/0071821 A1 | 4/2003 | Sundahl |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0178617 A1 | 9/2003 | Appenzeller et al. |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0233125 A1 | 11/2004 | Tanghe et al. |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0030267 A1 | 2/2005 | Tanghe et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0044227 A1 | 3/2006 | Hadcock |
| 2006/0066527 A1 | 3/2006 | Chou |
| 2006/0092185 A1 | 5/2006 | Jo et al. |
| 2006/0232522 A1 | 10/2006 | Roy et al. |
| 2006/0261841 A1 | 11/2006 | Fish |

(56) References Cited

U.S. PATENT DOCUMENTS

| | | |
|---|---|---|
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |
| 2007/0008268 A1 | 1/2007 | Park et al. |
| 2007/0008297 A1 | 1/2007 | Bassetti |
| 2007/0046195 A1 | 3/2007 | Chin et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2008/0122803 A1 | 5/2008 | Izadi et al. |
| 2008/0128598 A1* | 6/2008 | Kanai ............... H01L 27/14621 250/226 |
| 2008/0230118 A1 | 9/2008 | Nakatani et al. |
| 2009/0032807 A1 | 2/2009 | Shinohara et al. |
| 2009/0051283 A1 | 2/2009 | Cok et al. |
| 2009/0160743 A1 | 6/2009 | Tomida et al. |
| 2009/0162961 A1 | 6/2009 | Deane |
| 2009/0174628 A1 | 7/2009 | Wang et al. |
| 2009/0213046 A1 | 8/2009 | Nam |
| 2010/0052524 A1 | 3/2010 | Kinoshita |
| 2010/0078230 A1 | 4/2010 | Rosenblatt et al. |
| 2010/0079711 A1 | 4/2010 | Tanaka |
| 2010/0097335 A1 | 4/2010 | Jung et al. |
| 2010/0133994 A1 | 6/2010 | Song et al. |
| 2010/0134456 A1 | 6/2010 | Oyamada |
| 2010/0140600 A1 | 6/2010 | Clough et al. |
| 2010/0156279 A1 | 6/2010 | Tamura et al. |
| 2010/0237374 A1 | 9/2010 | Chu et al. |
| 2010/0328294 A1 | 12/2010 | Sasaki et al. |
| 2011/0090210 A1 | 4/2011 | Sasaki et al. |
| 2011/0133636 A1 | 6/2011 | Matsuo et al. |
| 2011/0180825 A1 | 7/2011 | Lee et al. |
| 2012/0212468 A1 | 8/2012 | Govil |
| 2013/0009930 A1 | 1/2013 | Cho et al. |
| 2013/0032831 A1 | 2/2013 | Chaji et al. |
| 2013/0113785 A1 | 5/2013 | Sumi |
| 2014/0300714 A1 | 10/2014 | Muller et al. |
| 2015/0270317 A1 | 9/2015 | Lee et al. |
| 2015/0279318 A1* | 10/2015 | Lee ............... G06T 1/60 345/690 |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| CN | 1448908 | 10/2003 |
| CN | 1776922 | 5/2006 |
| DE | 20 2006 005427 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| EP | 2317499 | 5/2011 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| JP | 2006065148 | 3/2006 |
| JP | 2009282158 | 12/2009 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 99/48079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).
Alexander et al.: "Unique Electrical Measurement Technology for Compensation, Inspection, and Process Diagnostics of AMOLED HDTV"; dated May 2010 (4 pages).
Ashtiani et al.: "AMOLED Pixel Circuit With Electronic Compensation of Luminance Degradation"; dated Mar. 2007 (4 pages).
Chaji et al.: "A Current-Mode Comparator for Digital Calibration of Amorphous Silicon AMOLED Displays"; dated Jul. 2008 (5 pages).
Chaji et al.: "A fast settling current driver based on the CCII for AMOLED displays"; dated Dec. 2009 (6 pages).

(56) References Cited

OTHER PUBLICATIONS

Chaji et al.: "A Low-Cost Stable Amorphous Silicon AMOLED Display with Full V~T- and V~O~L~E~D Shift Compensation"; dated May 2007 (4 pages).
Chaji et al.: "A low-power driving scheme for a-Si:H active-matrix organic light-emitting diode displays"; dated Jun. 2005 (4 pages).
Chaji et al.: "A low-power high-performance digital circuit for deep submicron technologies"; dated Jun. 2005 (4 pages).
Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-µA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report and Written Opinion for Application No. 08 86 5338 dated Nov. 2, 2011 (7 pages).
European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009 (2 pages).
European Search Report for European Application No. EP 07 71 9579 dated May 20, 2009.
European Search Report dated Mar. 26, 2012 in corresponding European Patent Application No. 10000421.7 (6 pages).
Extended European Search Report dated Apr. 27, 2011 issued during prosecution of European patent application No. 09733076.5 (13 pages).
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, dated Apr. 28, 2009 (3 pages).
International Search Report for International Application No. PCT/IB2011/055135, Canadian Patent Office, dated Apr. 16, 2012 (5 pages).
International Search Report dated Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a -Si for AMOLED—Meeting the Performance and Cost Demands of Display Applications (Cell Phone to HDTV)"; dated 2006 (4 pages).
Nathan et al.: "Thin film imaging technology on glass and plastic" ICM 2000, Proceedings of the 12th International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 dated Jul. 5, 2013; 8 pages.
Patent Abstracts of Japan, vol. 2000, No. 09, Oct. 13, 2000—JP 2000 172199 A, Jun. 3, 2000, abstract.
Patent Abstracts of Japan, vol. 2002, No. 3, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.
Philipp: "Charge transfer sensing" Sensor Review, vol. 19, No. 2, Dec. 31, 1999 (Dec. 31, 1999), 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).

(56) References Cited

OTHER PUBLICATIONS

Safavian et al.: "3-TFT active pixel sensor with correlated double sampling readout circuit for real-time medical x-ray imaging"; dated Jun. 2006 (4 pages).
Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Sanford, James L., et al., "4.2 TFT AMOLED Pixel Circuits and Driving Methods", SID 03 Digest, ISSN/0003, 2003, pp. 10-13.
Stewart M. et al., "Polysilicon TFT technology for active matrix OLED displays" IEEE transactions on electron devices, vol. 48, No. 5; Dated May 2001 (7 pages).
Tatsuya Sasaoka et al., 24.4L; Late-News Paper: A 13.0-inch AM-Oled Display with Top Emitting Structure and Adaptive Current Mode Programmed Pixel Circuit (TAC), SID 01 Digest, (2001), pp. 384-387.
Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Written Opinion dated Jul. 30, 2009 for International Application No. PCT/CA2009/000501 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.
International Search Report for Application No. PCT/IB2014/059409, Canadian Intellectual Property Office, dated Jun. 12, 2014 (4 pages).
Written Opinion for Application No. PCT/IB2014/059409, Canadian Intellectual Property Office, dated Jun. 12, 2014 (5 pages).
Extended European Search Report for Application No. EP 14181848.4, dated Mar. 5, 2015, (9 pages).

\* cited by examiner

HIGH PIXEL DENSITY ARRAY ARCHITECTURE

CROSS REFERENCE TO RELATED APPLICATION

This application is a continuation of U.S. patent application Ser. No. 15/087,278, filed Mar. 31, 2016, now allowed, which claims priority to Canadian Application No. 2,872,563, filed Nov. 28, 2014, both of which are hereby incorporated by reference herein in its entirety.

FIELD OF THE INVENTION

The present disclosure relates to pixel array architectures in visual display technology, and particularly to pixel array architectures for high density active matrix light emitting diode device (AMOLED) and other high density displays.

BRIEF SUMMARY

According to a first aspect there is provided a pixel array architecture of a display, the pixel array architecture comprising a matrix of subpixels grouped into pixels, the matrix of subpixels arranged in a rectilinear matrix oriented at an angle relative to a horizontal direction of the display, exhibiting a reduced pixel pitch for the subpixels.

In some embodiments, the reduced pixel pitch is less than or equal to a factor of $(½)^{1/2}$ times a pixel pitch of a substantially similar rectilinear matrix oriented at 0 degrees relative to the horizontal direction of the display, and wherein the angle is 45 degrees.

In some embodiments, the rectilinear matrix is substantially a square matrix.

In some embodiments, the subpixels are arranged into pixels, and the pixels arranged into rows and columns, each pixel having three subpixels and formed into a "v" shape oriented in one of a first direction and a second direction opposite from the first direction.

In some embodiments, the pixels are arranged one atop each other in columns such that alternating columns comprise pixels having "v" shapes oriented in opposite directions.

In some embodiments, each subpixel is shaped in the form of a square oriented at one of 0 degrees and 45 degrees from the horizontal direction of the display, and wherein each pixel comprises a green subpixel, a blue subpixel, and a red subpixel.

In some embodiments, the subpixels are arranged into pixels, and the pixels arranged into rows and columns, each pixel having three subpixels and formed into a slanted "I" shape.

In some embodiments, the pixels are formed into an "I" shape slanted at 45 degrees relative to the horizontal direction.

In some embodiments, the pixels are arranged in columns in a repeating pattern, in groups of two, one atop each other and overlapping only by two subpixels, with a vertical gap of a single subpixel in height between groups, the gap including a subpixel of a pixel of each neighboring column.

In some embodiments, each subpixel is shaped in the form of a square oriented at one of 0 degrees and 45 degrees from the horizontal direction of the display, and wherein each pixel comprises a green subpixel, a blue subpixel, and a red subpixel.

In some embodiments, the pixels are formed into "I" shapes slanted in one of a positive 45 degree slope and a negative 45 degree slope.

In some embodiments, the pixels are arranged in columns in a repeating pattern, one atop each other, alternating in slant form negative 45 degrees to positive 45 degrees, overlapping only by two subpixels, forming a snaking vertical pattern identical in geometry to a pattern of adjacent columns.

In some embodiments, the pixels are arranged in columns in a repeating pattern, one atop each other, alternating in slant form negative 45 degrees to positive 45 degrees, overlapping only by two subpixels, forming a snaking vertical pattern, wherein for one of the odd or even columns, each upper pixel sits atop a pixel below it on a longest side of the pixel below, wherein for the other of the odd or even columns an upper pixel sits atop a pixel below it on a shortest side of the pixel below.

In some embodiments, the subpixels are arranged into pixels, and the pixels arranged into rows and columns, each pixel having four subpixels and formed into a diamond shape, a first and a second of the four subpixels unshared with neighboring pixels, a third and a fourth subpixel of the four subpixels shared with neighboring pixels.

In some embodiments, the pixels are arranged in columns in a repeating pattern, one atop each other, overlapping only by two subpixels, forming a snaking vertical pattern identical in geometry to a pattern of adjacent columns, the leftmost and rightmost pixel of each pixel being shared with its respective left and right neighbor pixel.

In some embodiments, the first and second unshared subpixels are a green and a white subpixel and wherein the third and fourth shared subpixels are a red and a blue subpixel.

According to another aspect there is provided a pixel array architecture of a display, the pixel array architecture comprising a matrix of subpixels grouped into pixels arranged in rows and columns, the matrix of subpixels arranged based on a rectilinear matrix oriented at 45 degrees relative to a horizontal direction of the display, subsequently skewed to vertically align subpixels in every third subpixel row, exhibiting a reduced pixel pitch for the subpixels.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

The foregoing and other advantages of the disclosure will become apparent upon reading the following detailed description and upon reference to the drawings.

DETAILED DESCRIPTION

Pixel array arrangements and architectures are important for today's high density visual display technologies. One performance metric of such displays is the "pixel pitch" which is the nearest neighbor horizontal or vertical distance between subpixel elements, typically, although not limited to red, green, and blue subpixel elements which make up pixels common of modern displays.

While the embodiments described herein will be in the context of high density AMOLED displays it should be understood that the pixel array architectures described herein are applicable to any other display comprising pixels each having a plurality of subpixels, including but not limited to liquid crystal displays (LCD), light emitting diode displays (LED), electroluminescent displays (ELD), organic light emitting diode displays (OLED), plasma display panels (PSP), among other displays.

It should be understood that the embodiments described herein pertain to subpixel and pixel array architectures and do not limit the display technology underlying their operation and the operation of the displays in which they are implemented. Implementation of various types of visual display technologies for designing, manufacturing, and driving the displays comprising the subpixels and pixels in the architectures described herein are well beyond the scope of this document but are nonetheless known to persons having skill in the art. Patents which describe innovative technologies in relation to high resolution AMOLED displays include U.S. Pat. Nos. 8,552,636, 8,803,417, and 9,059,117, each entitled "High Resolution Pixel Architecture" and granted to Chaji et al.

Figure 1:
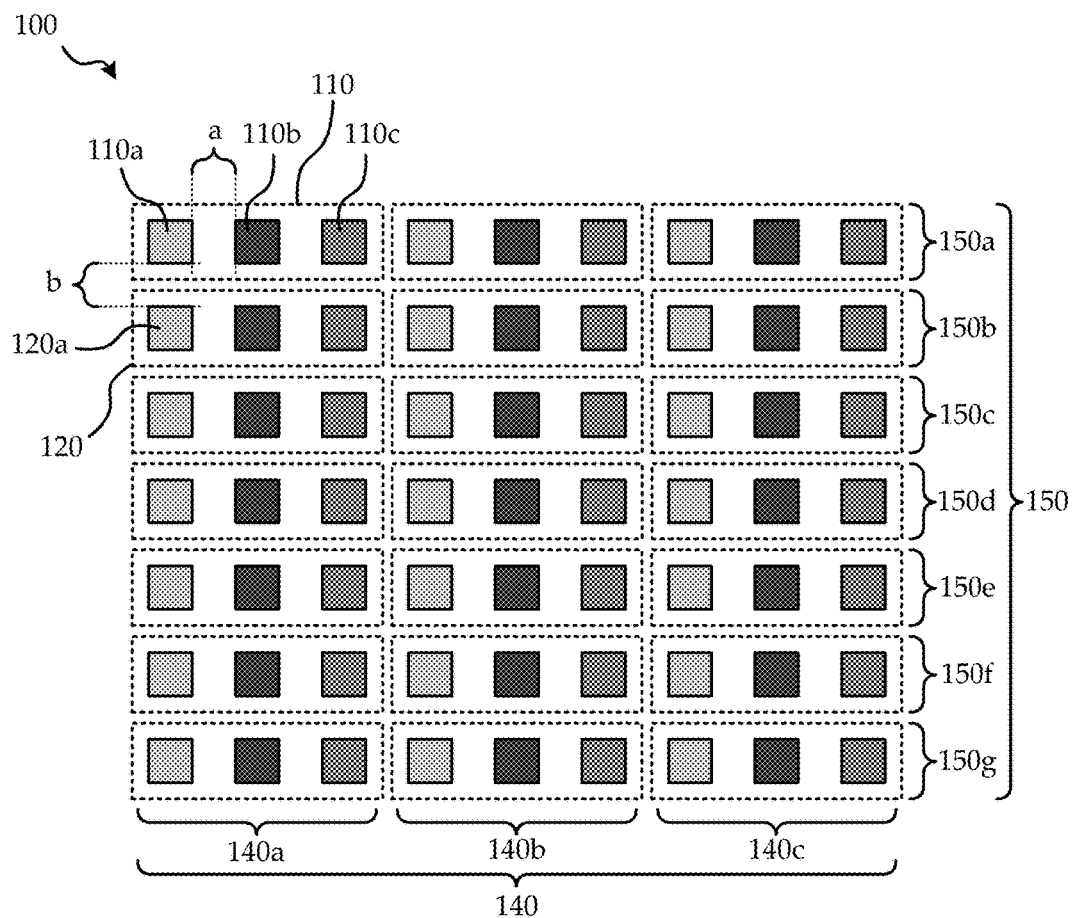
FIG. 1 illustrates a known pixel array arrangement.

Referring to FIG. 1, a known pixel array architecture 100 of a known display and its pixel pitch will now be discussed.

The known pixel array structure 100 is divided into an array of pixels 110, 120 (illustrated with dotted lines) arranged in individual rows 150a, . . . , 150g, collectively referred to as rows 150 of the display, as well as individual columns 140a, . . . , 140c, collectively referred to as columns 140 of the display. Each pixel 110 is comprised of a plurality of subpixels 110a, 110b, 110c, each of a different type which is responsible for providing a component, channel, or color of the pixel. In the pixel array structure 100 of FIG. 1, each pixel is composed of red, green, and blue subpixels, represented in shades of grey in no particular order.

A horizontal pixel pitch a is shown between a first subpixel 110a of the top left pixel 110 and its horizontally nearest neighbor subpixel 110b. A vertical pitch b is shown between the first subpixel 110a of the top left pixel 110 and its vertically nearest neighbor subpixel 120a of the pixel 120 below the top left pixel 110. A minimum pixel pitch is defined as the lesser of a and b.

Known pixel array structures 100 have subpixels 110a of various shapes and sizes. As shown in the figure the pixel pitch is calculated from the outermost portion of the subpixels 110a defining the vertical or horizontal spacing between them. In a case such as depicted where the pixels, and subpixels are each rectangular and arranged in a rectilinear array, the horizontal and vertical pixel pitch may be simply expressed.

To characterize the array structure for a generic case, pixel size and shape will first be ignored to determine a maximum possible pixel pitch given the array structure. Given a rectilinear subpixel matrix having a vertical spacing B between centers of nearest neighbor subpixels, and a horizontal spacing A between centers of nearest neighbor subpixels, the maximum pitches possible, in the limit of vanishing subpixel size, is the minimum of A and B. In a square subpixel matrix, where A and B are equal to a single subpixel matrix element spacing D, the maximum possible pixel pitch is D.

In the specific case illustrated in FIG. 1, of an array of pixels having square pixels of width w, where w is smaller than D and may be expressed as k*D, the horizontal pitch a equals vertical pitch b and is equal to the spacing D minus the width w; or D−w. Expressing w in terms of D the pixel pitch (PP) for the pixel array structure 100 is: PP=D*(1−k).

Figure 2:
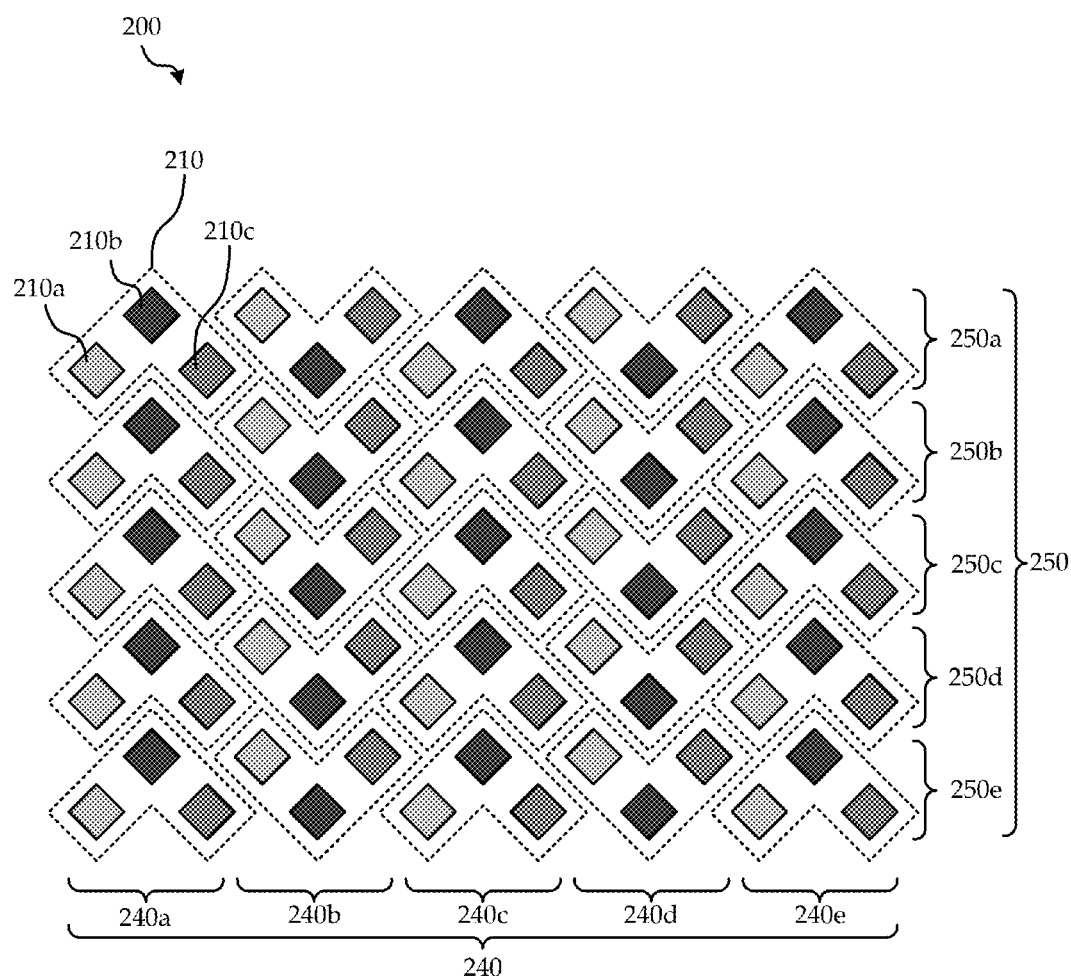
FIG. 2 illustrates a first high density pixel array architecture.

Referring to FIG. 2, a pixel array architecture 200 of a first embodiment will now be discussed.

The pixel array architecture 200 is divided into an array of pixels 210 arranged in individual rows 250a, . . . , 250e, collectively referred to as rows 250 of the display, as well as individual columns 240a, . . . , 240e, collectively referred to as columns 240 of the display. Each pixel 210 is comprised of a plurality of subpixels 210a, 210b, 210c, each of a different type which is responsible for providing a component, channel, or color of the pixel. In the pixel array architecture 200 of FIG. 2, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 200 each pixel 210 has subpixels 210a, 210b, 210c, in a similar configuration to that of all the other pixels. This leads to a subpixels of the same color or type of subpixel 210a, 220a being arranged in subpixel columns within the pixel columns 240a. Other embodiments possess pixels 210 each having subpixels 210a, 210b, 210c in different configurations which may or may not result in the formation of columns of subpixels of the same type.

The pixel array architecture of FIG. 2 is based on a diamond shaped subpixel matrix, which is a rectilinear matrix rotated by 45 degrees. Each pixel is defined from three subpixels 210a, 210b, 210c, in a "v" or upside-down "v" configuration. Each column 240a, . . . 240e comprises either pixels in the "v" configuration arranged one atop the other or pixels in the upside-down "v" configuration arranged one atop the other. Adjacent columns 240 alternate between those 240b, 240e having pixels with a "v" configuration and those 240a, 240c, 240e having pixels with an upside-down "v" configuration.

Figure 3:
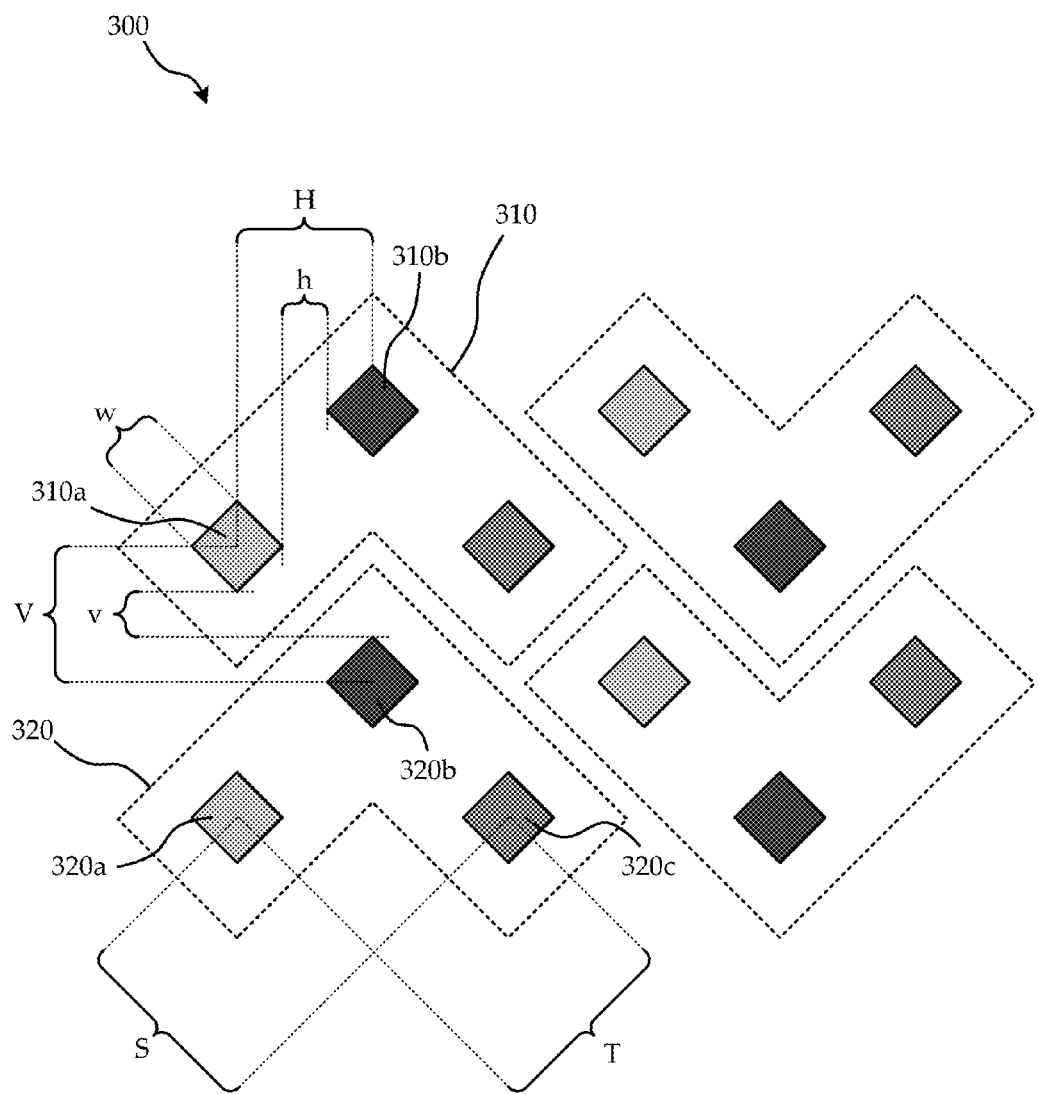
FIG. 3 is close-up view of the high density pixel array architecture of FIG. 2.

Referring now also to FIG. 3 a pixel pitch of the pixel array architecture of FIG. 3 will now be discussed.

A horizontal pixel pitch h is shown between a first subpixel 310a of the top left pixel 310 and its horizontally nearest neighbor subpixel 310b. A vertical pitch v is shown between the first subpixel 310a of the top left pixel 310 and its vertically nearest neighbor subpixel 320b of the pixel 320 below the top left pixel 310. A minimum pixel pitch is defined as the lesser of h and v.

Pixel array architecture 300 may have subpixels 310a of various shapes and sizes. As shown in the figure the pixel pitch is calculated from the outermost portion of the subpixels 310a defining the vertical or horizontal spacing between them. In a case such as depicted where the pixels, and subpixels are each based on a 45 degree rotation of rectangular pixels and subpixels arranged in a rectilinear array, the horizontal and vertical pixel pitch may be simply expressed.

To characterize the array structure for a generic case, pixel size and shape will first be ignored to determine a maximum possible pixel pitch given the array architecture. Given a 45 degree rotated rectilinear subpixel matrix having a first spacing S between centers of nearest neighbor subpixels, and a second spacing T (at right angles to the first spacing) between centers of nearest neighbor subpixels, the maximum pitches possible, in the limit of vanishing subpixel size, is the minimum of $S*(1/2)^{1/2}$ and $T*(1/2)^{1/2}$. In a rotated square subpixel matrix, where S and T are equal to a single subpixel matrix element spacing D, the maximum possible pixel pitch is $D*(1/2)^{1/2}$. In the limit of small to vanishing subpixel sizes, the largest possible pixel pitch is ~0.7 times that of the unrotated known pixel array structure of FIG. 1, representing a higher density according to the accepted definition of the pixel pitch performance metric.

In the specific case illustrated of an array of pixels having square pixels (rotated 45 degrees) of width w, where w is smaller than D and may be expressed as k*D, the horizontal pitch h is equal to the horizontal spacing H minus $w*2^{1/2}$, or $H-w*2^{1/2}$, and the vertical pitch v is equal to the vertical spacing V minus $w*2^{1/2}$, or $V-w*2^{1/2}$. In an embodiment where S and T are equal to a single subpixel matrix element spacing D, H equals V and has a value of $D*(1/2)^{1/2}$. In such a case the vertical and horizontal pitches v and h are equal to a single pixel pitch. Expressing w in terms of D, the pixel pitch (PP) for the pixel array architecture 200 is: PP=$D*(1/2)^{1/2}*(1-2k)$. It should be noted that when k is 0.5 the pixel pitch goes to zero.

The ratio of the pixel pitch of the pixel array architecture 200 of FIG. 2 to that of the pixel array structure 100 of FIG. 1 is $D*(1/2)^{1/2}*(1-2k)/D*(1-k)$ which equals $(1/2)^{1/2}*(1-2k)/(1-k)$. This value is at most $(1/2)^{1/2}$ (which roughly equals 0.7) when k vanishes, and is zero when k is 0.5. As such, the pixel pitch of the pixel array architecture 200 is at most 0.7 of that of the pixel array structure 100, and may take on values less than that depending upon the ratio of to D.

It should be clear that the achieving of lower vertical and horizontal pixel pitch through use of a 45 degree rotated rectilinear subpixel matrix, when compared to an unrotated rectilinear matrix, does not generally depend upon the pixel size, shape, or the particular unrotated horizontal and vertical spacing of the subpixel matrix. As such, each of the following embodiments, utilizing such a rotated subpixel matrix, will exhibit improved pixel pitch performance metrics in a substantially similar manner to that illustrated above, regardless of the subpixel shape and the particular way the subpixels are grouped into pixels, columns, and rows. It also should be understood that some angle other than 45 degrees can reduce pixel pitch in accordance with the above discussion.

Figure 4:
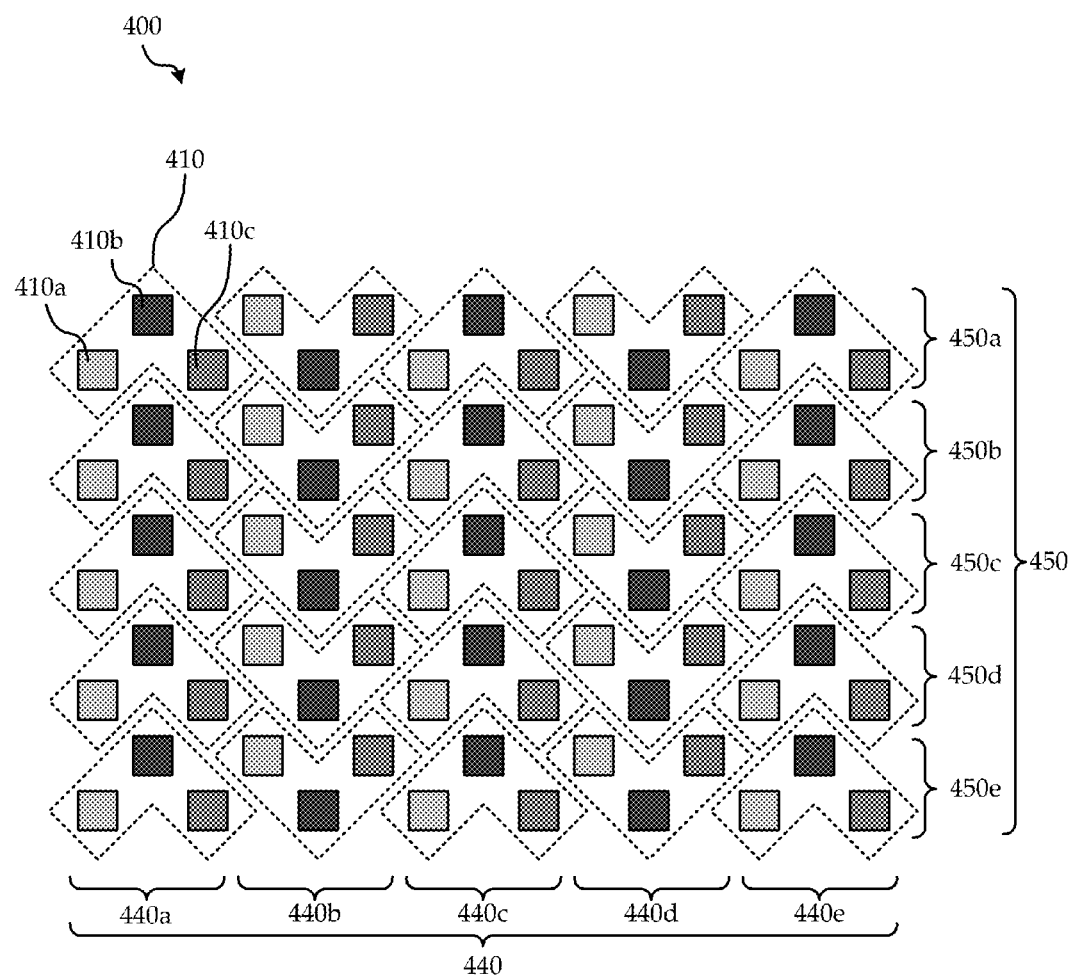
FIG. 4 illustrates a variation of the first high density pixel array architecture of FIG. 2.

Referring to FIG. 4, a pixel array architecture 400 of a variation on the first embodiment will now be discussed.

The pixel array architecture 400 is divided into an array of pixels 410 arranged in individual rows 450a, . . . , 450e, collectively referred to as rows 450 of the display, as well as individual columns 440a, . . . , 440e, collectively referred to as columns 440 of the display. Each pixel 410 is comprised of a plurality of subpixels 410a, 410b, 410c, each of a different type which is responsible for providing a component, channel, or color of the pixel. In the pixel array architecture 400 of FIG. 4, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 400 each pixel 410 has subpixels 410a, 410b, 410c, in a similar configuration to that of all the other pixels. This leads to a subpixels of the same color or type of subpixel being arranged in subpixel columns within the pixel columns 440a. Other embodiments possess pixels 410 each having subpixels 410a, 410b, 410c in different configurations which may or may not result in the formation of columns of subpixels of the same type.

The pixel array architecture 400 of FIG. 4 differs from that of the first embodiment of FIG. 2, by use of square subpixels whose sides are parallel to the vertical and horizontal directions of the display rather than rotated at 45 degrees as is the case for the subpixels of FIG. 2.

Similar to the pixel array architecture of FIG. 2 that of FIG. 4 is based on a diamond shaped subpixel matrix, which is a rectilinear matrix rotated by 45 degrees. Each pixel is defined from three subpixels 410a, 410b, 410c, in a "v" or upside-down "v" configuration. Each column 440a, . . . 440e comprises either pixels in the "v" configuration arranged one atop the other or pixels in the upside-down "v" configuration arranged one atop the other. Adjacent columns 440 alternate between those 440b, 440e having pixels with a "v" configuration and those 440a, 440c, 440e having pixels with an upside-down "v" configuration.

Figure 5:
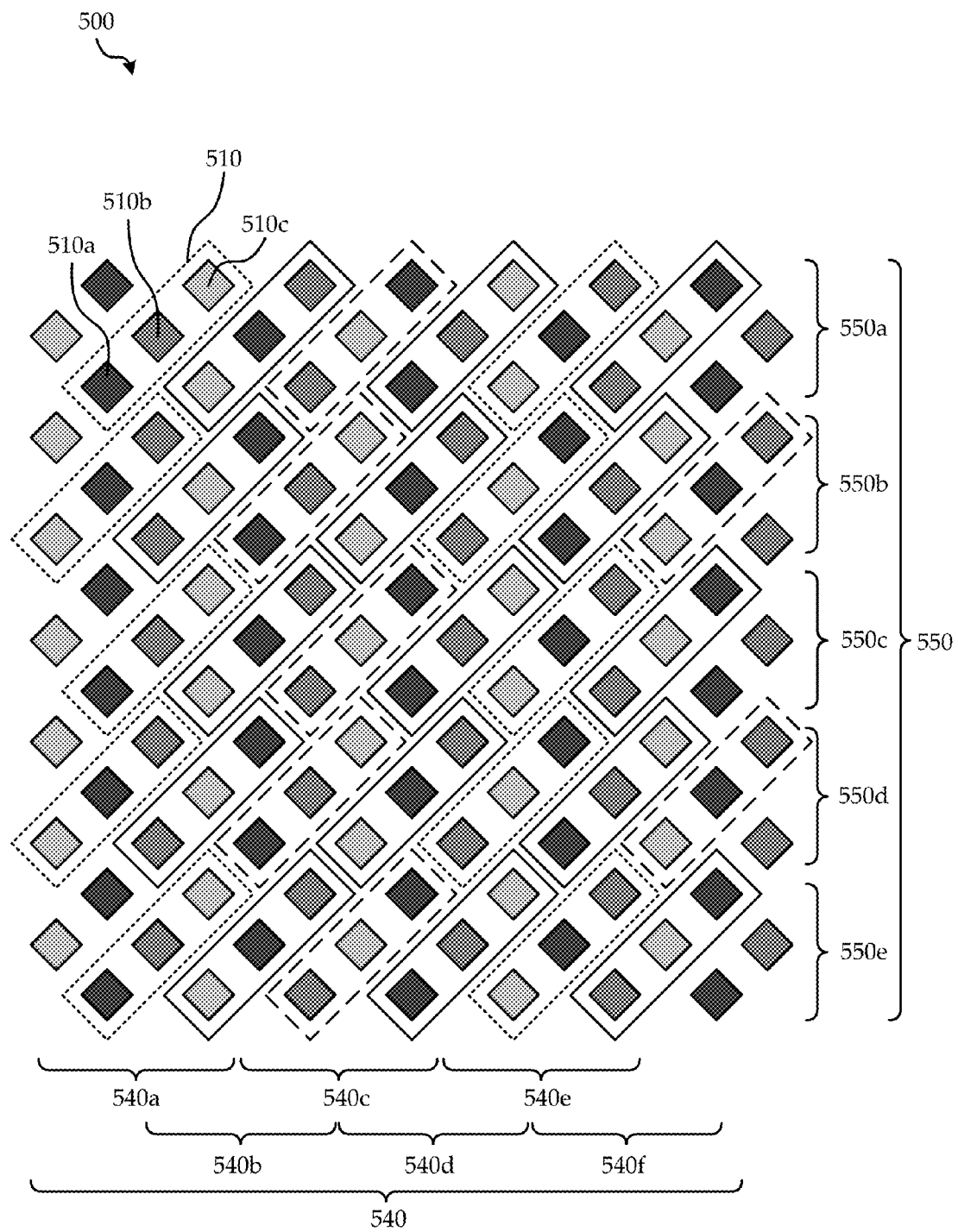
FIG. 5 illustrates a second high density pixel array architecture.

Referring to FIG. 5, a pixel array architecture 500 of a second embodiment will now be discussed.

The pixel array architecture 500 is divided into an array of pixels 510 arranged in individual rows 550a, . . . , 550e, collectively referred to as rows 550 of the display, as well as individual overlapping columns 540a, . . . , 540f, collectively referred to as columns 540 of the display. Each pixel 510 is comprised of a plurality of subpixels 510a, 510b, 510c, each of a different type which is responsible for providing a component, channel, or color of the pixel. In the pixel array architecture 500 of FIG. 5, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 500 each pixel 510 has subpixels 510a, 510b, 510c, in various different orders within a similar configuration. It so happens that subpixels of the same color or type of subpixel are arranged in subpixel columns within the pixel columns 540a even though pixels have various subpixel distributions within them.

Similar to the pixel array architecture of FIG. 2 that of FIG. 5 is based on a diamond shaped subpixel matrix, which is a rectilinear matrix rotated by 45 degrees.

The pixel array architecture 500 of FIG. 5 differs from that of FIG. 2 in how subpixels are arranged into pixels 510. Each pixel is defined from three subpixels 510a, 510b, 510c, in a slanted "I" configuration, each pixel slanting at 45 degrees. Each column 540a, . . . 540f comprises pixels in the "I" configuration arranged in groups of two one atop each other and overlapping only by two subpixels, with a vertical gap of a single subpixel in height between groups, the gap having a subpixel of a pixel of each neighboring column. For example, column 540c (illustrated with dashed lines) includes groups of two pixels, overlapping horizontally (from a vertical perspective) by two subpixels, each group separated by a slanting gap, which in the overlap region includes a subpixel of a pixel of the adjacent column 540b, and a subpixel of a pixel of the adjacent column 540d.

Figure 6:
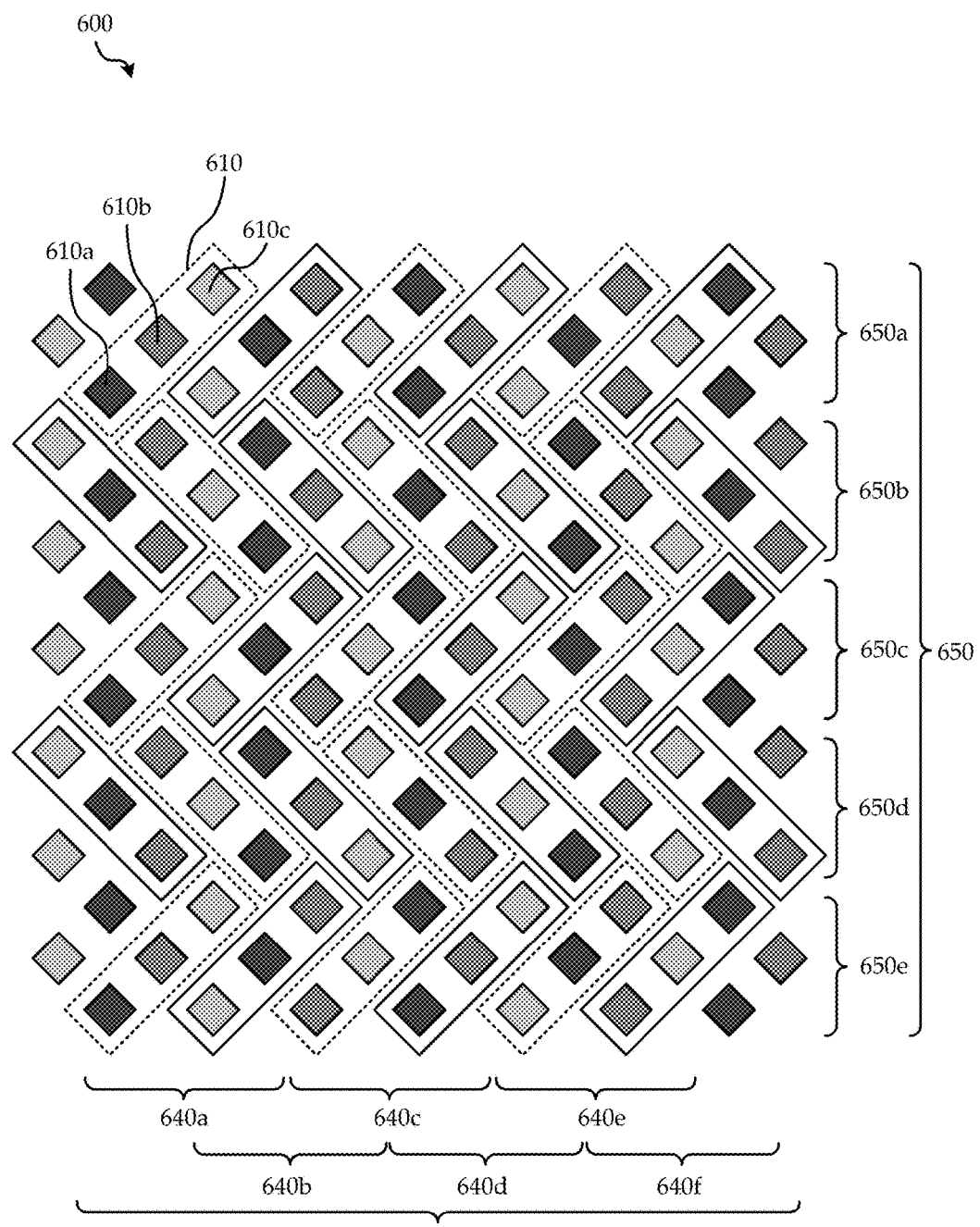
FIG. 6 illustrates a third high density pixel array architecture.

Referring to FIG. 6, a pixel array architecture 600 of a third embodiment will now be discussed.

The pixel array architecture 600 is divided into an array of pixels 610 arranged in individual rows 650a, . . . , 650e, collectively referred to as rows 650 of the display, as well as individual overlapping columns 640a, . . . , 640f, collectively referred to as columns 640 of the display. Each pixel 610 is comprised of a plurality of subpixels 610a, 610b, 610c, each of a different type which is responsible for providing a component, channel, or color of the pixel. In the pixel array architecture 600 of FIG. 6, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 600 each pixel 610 has subpixels 610a, 610b, 610c, in various different orders within a similar configuration. It so happens that subpixels of the same color or type of subpixel are arranged in subpixel columns within the pixel columns 640a even though pixels have various subpixel distributions within them.

Similar to the pixel array architecture of FIG. 2 that of FIG. 6 is based on a diamond shaped subpixel matrix, which is a rectilinear matrix rotated by 45 degrees.

The pixel array architecture 600 of FIG. 6 differs from that of FIG. 2 in how subpixels are arranged into pixels 610. Similar to the embodiment of FIG. 5 each pixel is defined from three subpixels 610a, 610b, 610c, in a slanted "I" configuration, each pixel slanting at positive or negative 45 degrees. Different from the embodiment of FIG. 5 is the inclusion of pixels which slant in different directions, i.e. of opposite slope. Each column 640a, . . . 640f comprises pixels in the "I" configuration arranged one atop each other, alternating in slant form one direction (negative slope) to the other direction (positive slope), and overlapping only by two subpixels, with no vertical gap, but forming a snaking vertical pattern. Moreover, the pixel outline structure of each column is identical to that of its adjacent columns.

Figure 7:
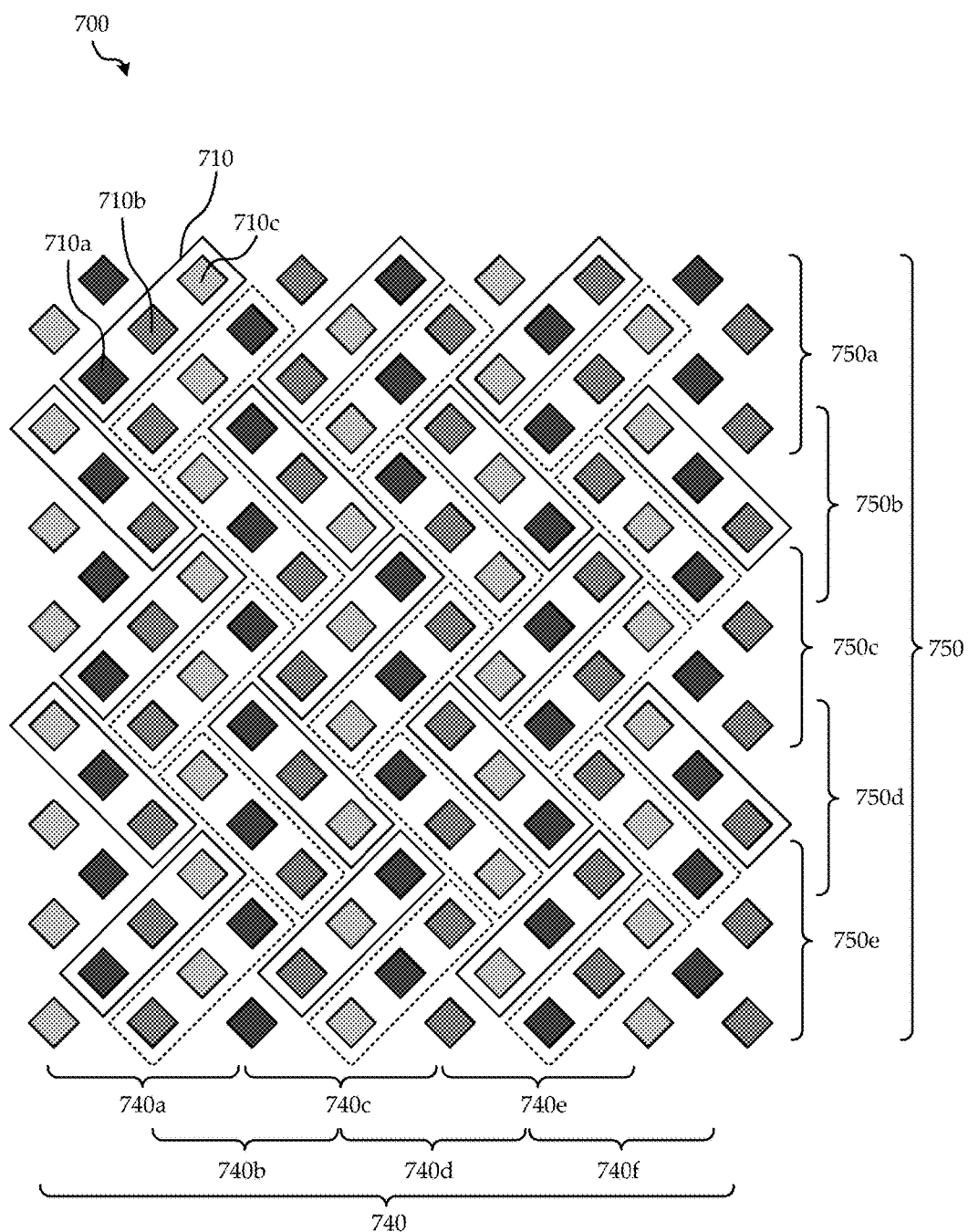
FIG. 7 illustrates a fourth high density pixel array architecture.

Referring to FIG. 7, a pixel array architecture 700 of a fourth embodiment will now be discussed.

The pixel array architecture 700 is divided into an array of pixels 710 arranged in individual overlapping rows 750a, . . . , 750e, collectively referred to as rows 750 of the display, as well as individual overlapping columns 740a, . . . , 740f, collectively referred to as columns 740 of the display. Each pixel 710 is comprised of a plurality of subpixels 710a, 710b, 710c, each of a different type which is responsible for providing a component, channel, or color of the pixel. In the pixel array architecture 700 of FIG. 7, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 700 each pixel 710 has subpixels 710a, 710b, 710c, in various different orders within a similar configuration. It so happens that subpixels of the same color or type of subpixel are arranged in subpixel columns within the pixel columns 740a even though pixels have various subpixel distributions within them.

Similar to the pixel array architecture of FIG. 2 that of FIG. 7 is based on a diamond shaped subpixel matrix, which is a rectilinear matrix rotated by 45 degrees.

The pixel array architecture 700 of FIG. 7 differs from that of FIG. 2 in how subpixels are arranged into pixels 710. Similar to the embodiment of FIG. 7 each pixel is defined from three subpixels 710a, 710b, 710c, in slanted "I" configurations slanting in different directions, each pixel slanting at positive or negative 45 degrees. Each column 740a, . . . 740f comprises pixels in the "I" configuration arranged one atop each other, alternating in slant form one direction (negative 45 degree slope) to the other direction (positive 45 degree slope), and overlapping only by two subpixels, with no vertical gap, but forming a snaking vertical pattern. In this embodiment, as opposed to that of FIG. 6, the pixel outline structure of each column is not identical to that of its adjacent columns. In the snaking pattern of one column, an upper pixel sits atop the pixel below it on the longest side of the pixel below, while in an adjacent column, the upper pixel sits atop the pixel below it on the shortest side of the pixel below. This results in a slightly different pattern having overlapping rows 750a, . . . , 750e.

Figure 8:
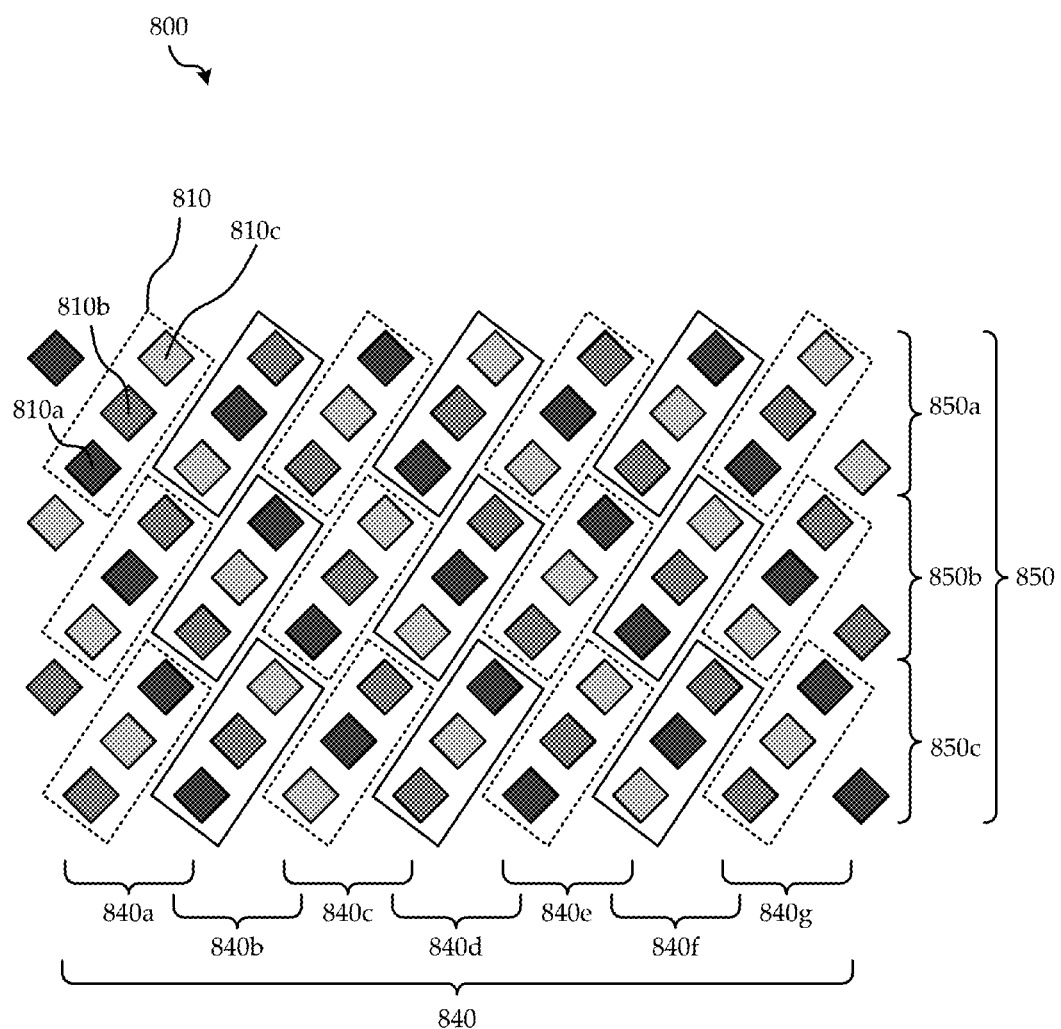
FIG. 8 illustrates a fifth high density pixel array architecture.
Figure 9:
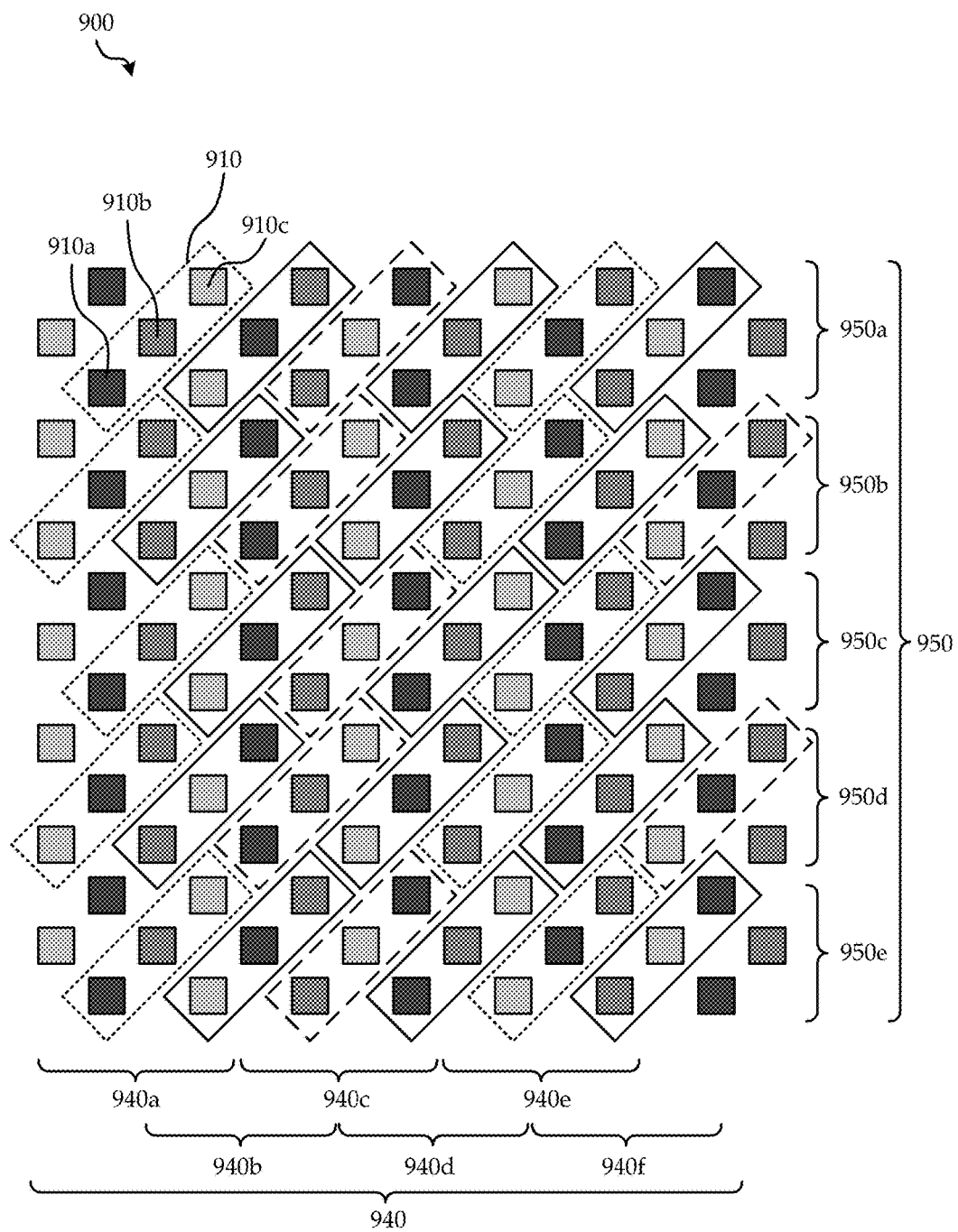
FIG. 9 illustrates a variation of the second high density pixel array architecture.
Figure 10:
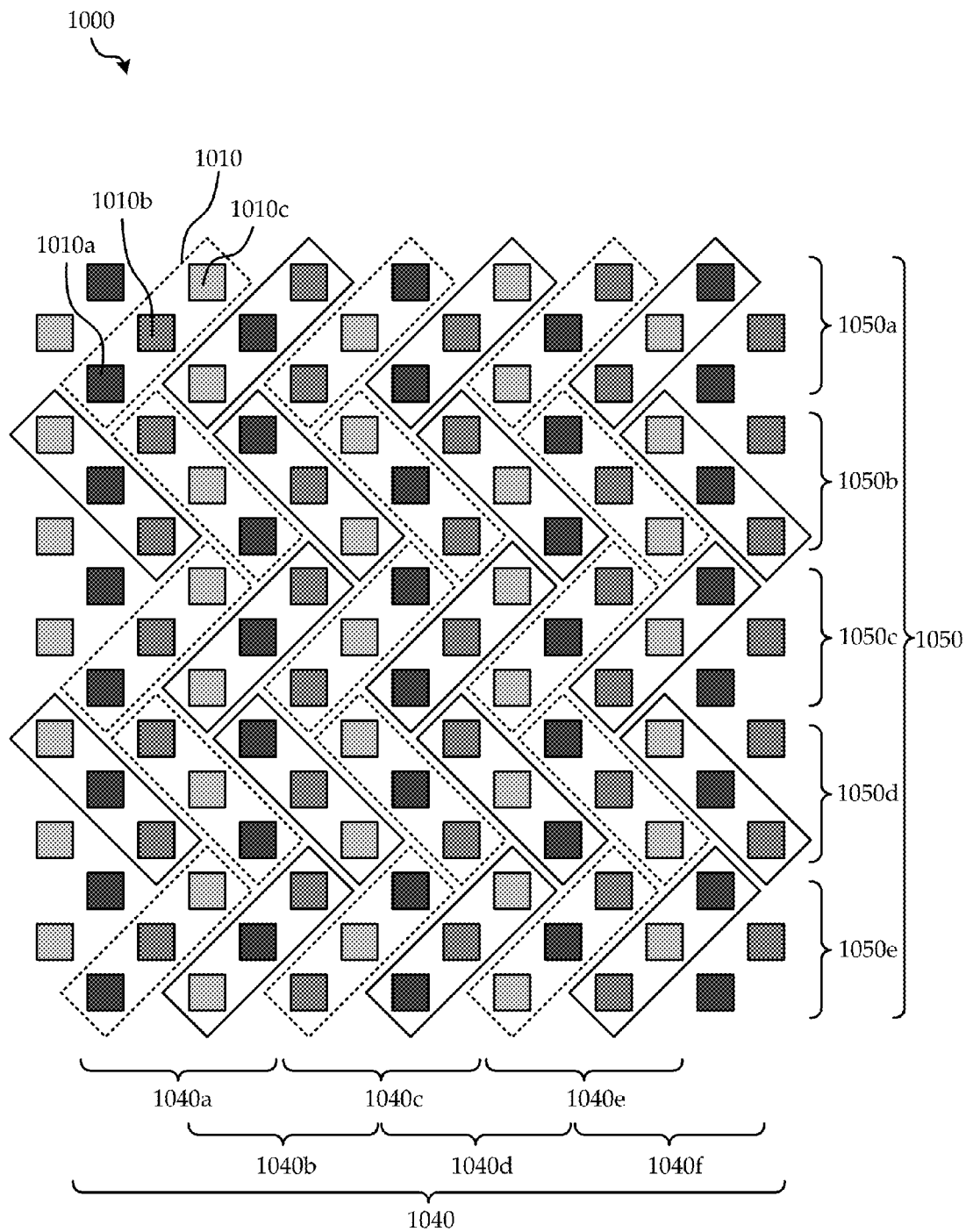
FIG. 10 illustrates a variation of the third high density pixel array architecture.
Figure 11:
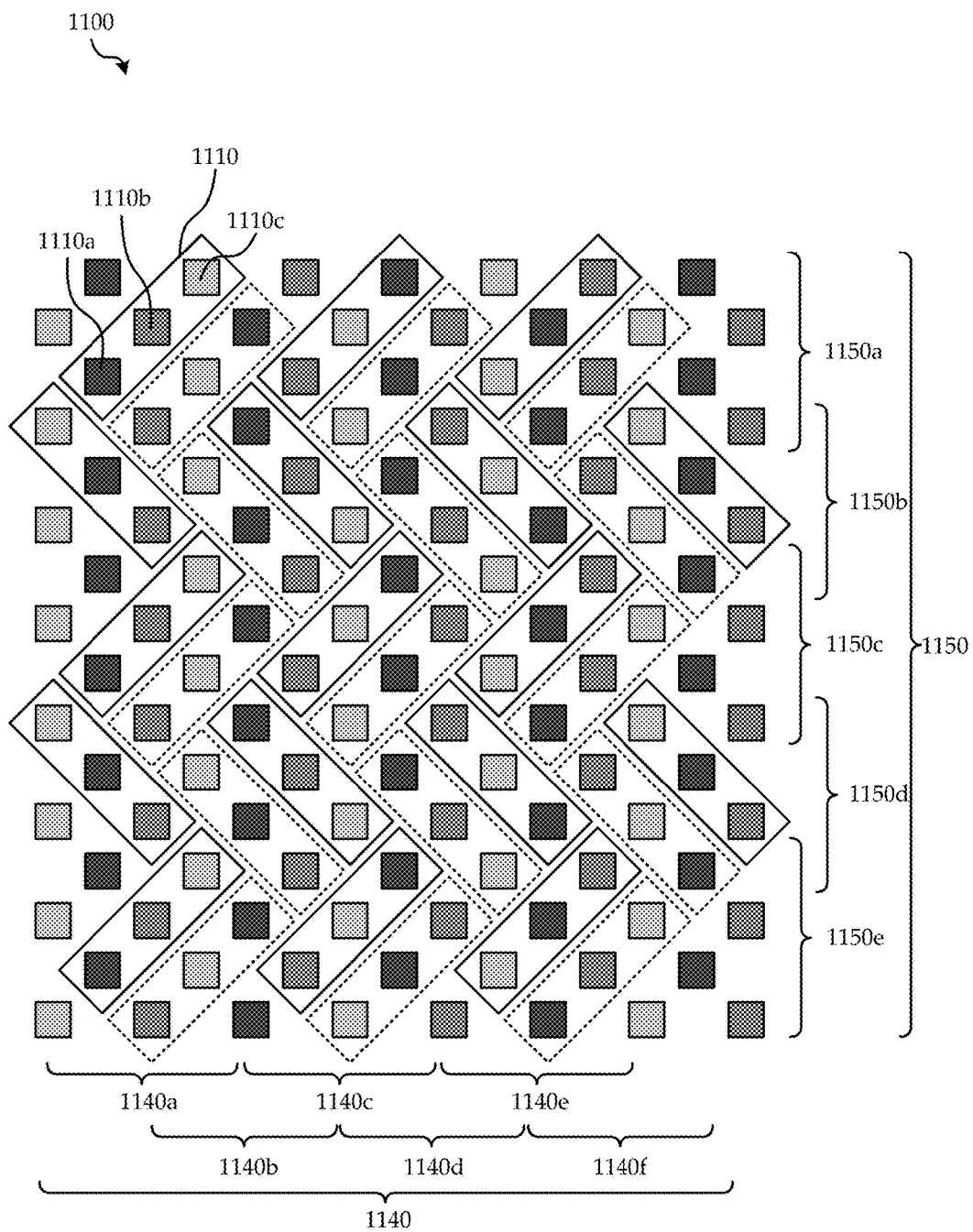
FIG. 11 illustrates a variation of the fourth high density pixel array architecture.
Figure 12:
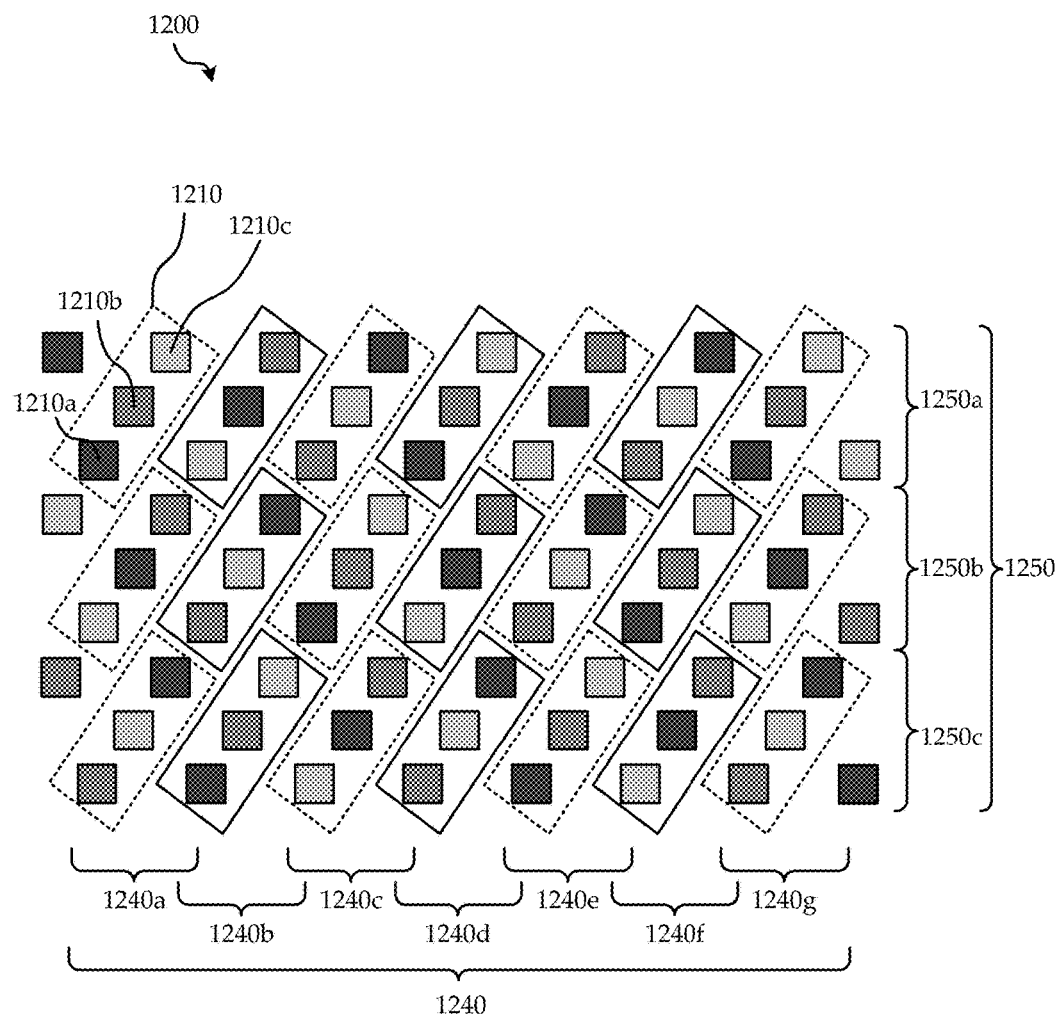
FIG. 12 illustrates a variation of the fifth high density pixel array architecture.

Referring to FIG. 8, a pixel array architecture 800 of a fifth embodiment will now be discussed.

The pixel array architecture 800 is divided into an array of pixels 810 arranged in individual rows 850a, . . . , 850c, collectively referred to as rows 850 of the display, as well as individual overlapping columns 840a, . . . , 840g, collectively referred to as columns 840 of the display. Each pixel 810 is comprised of a plurality of subpixels 810a, 810b, 810c, each of a different type which is responsible for providing a component, channel, or color of the pixel. In the pixel array architecture 800 of FIG. 8, each pixel is composed of red, green, and blue subpixels, represented in shades of grey in no particular order. It is to be understood that embodiments comprising pixels having subpixels other than red, green, and blue, or a number of subpixels other than three, are contemplated.

In the pixel array architecture 800 each pixel 810 has subpixels 810a, 810b, 810c, in various different orders within a similar configuration. It so happens that subpixels of the same color or type of subpixel are arranged in subpixel columns within the pixel columns 840a even though pixels have various subpixel distributions within them.

Similar to the pixel array architecture of FIG. 2 that of FIG. 5 is based on a diamond shaped subpixel matrix, which is a rectilinear matrix rotated by 45 degrees, but with a further skew or parallelogram transformation to bring the defined pixels into columns in the vertical direction.

The pixel array architecture 800 of FIG. 8 is similar to that of FIG. 5 in that each pixel is defined from three subpixels 810a, 810b, 810c, in a slanted "I" configuration. It differs from that of FIG. 5 in that the pixels, by virtue of the skewed array, can be arranged atop one another in slightly overlapping vertical columns 840a, . . . , 840g. In particular every subpixel is vertically aligned with subpixels in every third subpixel row, i.e. each subpixel of a pixel is aligned with the same positioned subpixel in the pixel below it.

FIG. 9, FIG. 10, FIG. 11, and FIG. 12, illustrate variations of embodiments respectively depicted in FIG. 5, FIG. 6, FIG. 7, and FIG. 8. Each of the pixel array architectures 900, 1000, 1100, and 1200 is substantially equivalent respectively to pixel array architecture 500, 600, 700, and 800 differing only by use of square subpixels whose sides are parallel to the vertical and horizontal directions of the display rather than rotated at 45 degrees as is the case for the subpixels of each of architectures 500, 600, 700, and 800 of respectively FIG. 5, FIG. 6, FIG. 7, and FIG. 8.

Figure 13:
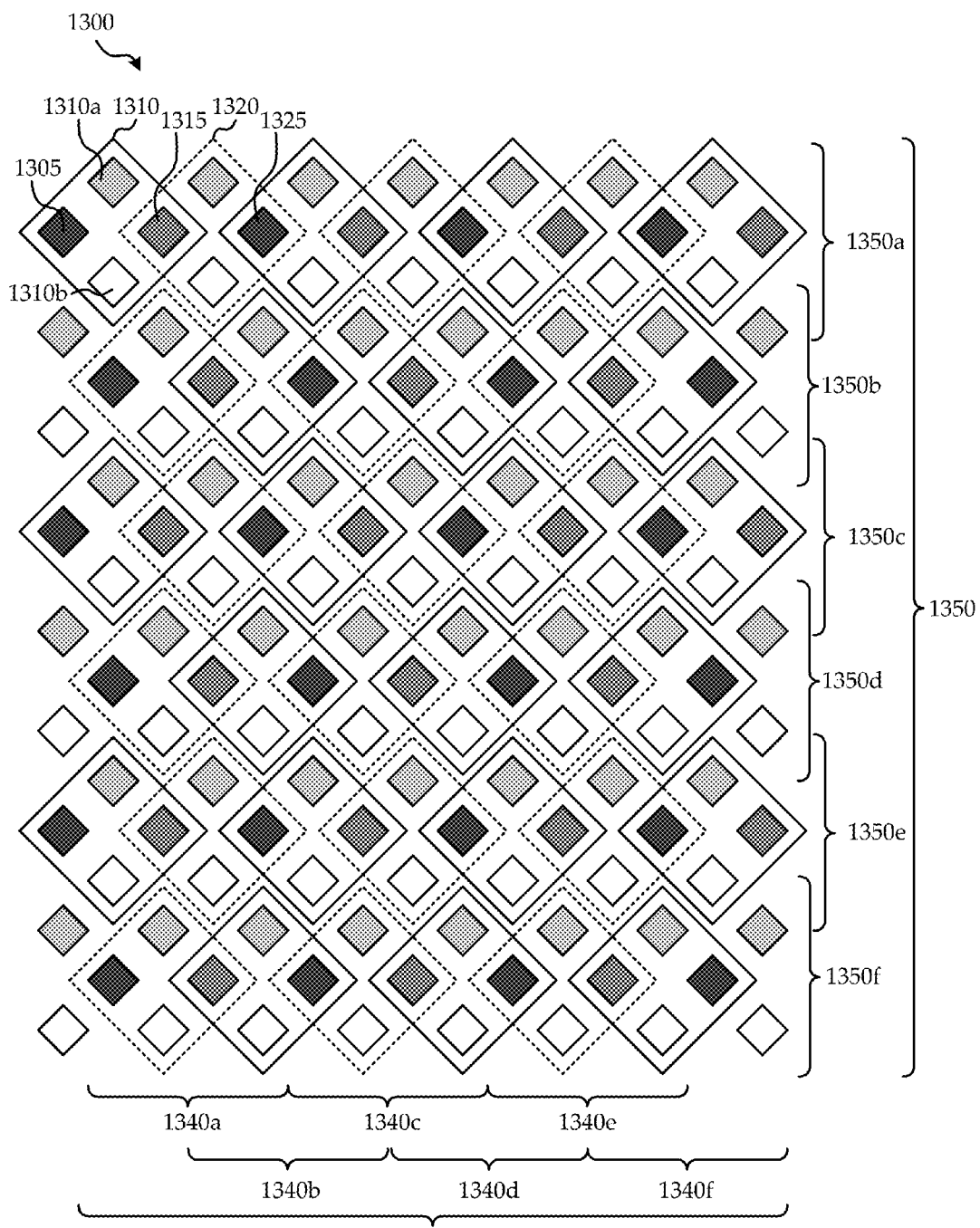
FIG. 13 illustrates a sixth high density pixel array architecture.

Referring to FIG. 13, a pixel array architecture 1300 of a sixth embodiment will now be discussed.

The pixel array architecture 1300 is divided into an array of pixels 1310, 1320 arranged in individual overlapping rows 1350a, . . . , 1350f, collectively referred to as rows 1350 of the display, as well as individual overlapping columns 1340a, . . . , 1340f, collectively referred to as columns 1340 of the display. Each pixel 1310 is comprised of a plurality of subpixels 1310a, 1310b, which it does not share with other pixels and a plurality of subpixels 1305, 1315 which it does share with other pixels. Within each pixel each subpixel is of a different type which is responsible for providing a component, channel, or color of the pixel.

In the pixel array architecture 1300 of FIG. 13, each pixel is composed of a green 1320a and a white 1310b unshared subpixel, as well as a shared red 1305 and a shared blue 1315 subpixel, each represented in a corresponding shade of grey. Because red and blue offer more color information on a typical display, they have been chosen as the shared pixels to minimize loss of information. It is to be understood that embodiments comprising pixels having subpixels other than red, green, blue, and white, or a number of subpixels other than four, are contemplated. It is also to be understood that subpixels of colors other than red or blue may be shared between pixels, that green and white subpixels may be shared, and that subpixels other than white and green may be unshared, including red and blue subpixels.

In the pixel array architecture 1300 each pixel 1310 has a green subpixel 1310a as its uppermost subpixel, a white subpixel 1310b as it lowermost subpixel and one of a red or a blue subpixel as its leftmost subpixel and the other of a red or blue subpixel as its rightmost subpixel. For example, in each row 1350a, . . . , 1350f, pixels of alternating columns have alternating left-right configurations of red and blue subpixels.

The green and white subpixels of the pixel array architecture 1300 each form subpixel rows within each row 1350a, . . . , 1350f, while the red and blue subpixels forms a subpixel row of alternating red and blue subpixels within each row 1350a, . . . , 1350f.

The pixel array architecture of FIG. 13 is based on a diamond shaped subpixel matrix, which is a rectilinear matrix rotated by 45 degrees. Each pixel is defined from four subpixels 1310a, 1310b, 1305, 1315, in a diamond configuration. Each column 1340a, . . . 1340f comprises pixels in the diamond configuration arranged one atop of the other in a snaking pattern, overlapping horizontally by two subpixels, from a vertical perspective. Adjacent columns 1340 snake in the same direction at each row.

Although pixels in the various embodiment have been depicted with particular orientations, it should be understood that equivalent orientations of each embodiment obtained by a reflection in the horizontal or vertical axis or a rotation of a multiple of 90 degrees is contemplated. For clarity an embodiment having an arrangement of "v" and an upside down "v" shaped pixels is equivalent to an embodiment with right opening "v" and left opening "v" shaped pixels.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

While particular implementations and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of an invention as defined in the appended claims.

What is claimed is:

1. A display device comprising a matrix of subpixels grouped into pixels, the matrix of subpixels arranged in a substantially rectilinear matrix oriented at substantially a 45 degree angle relative to a major axis of the display, each pixel forming a right angle shape oriented in one of a first direction and a second direction opposite from the first direction.

2. The display device of claim 1, wherein the pixels are arranged in rows and columns such that alternating columns comprise pixels having subpixels forming right angle shapes oriented in opposite directions.

3. The display device of claim 1, wherein the pixels are arranged in rows and columns such that adjacent pixels in each column comprise pixels having subpixels forming right angle shapes oriented in opposite directions.

4. The display device of claim 2 wherein each subpixel is shaped substantially in the form of a square oriented at one of 0 degrees and 45 degrees from an axis of the rectilinear matrix of subpixels.

5. The display device of claim 2 wherein each pixel comprises three subpixels.

6. The display device of claim 1 wherein each pixel comprises three subpixels.

7. A display device comprising a matrix of subpixels grouped into pixels, the matrix of subpixels arranged in a substantially rectilinear matrix oriented at substantially a 45 degree angle relative to a major axis of the display, each pixel and formed into an "I" shape slanted at 45 degrees relative to the major axis of the display, each pixel having a length unequal to a width of the pixel.

8. This display device of claim 7, wherein the pixels are arranged in a repeating pattern along a first direction, in groups of two pixels adjacent one another in the first direction and overlapping only by two subpixels, with a gap in said first direction of a single subpixel between groups, the gap including a subpixel of neighboring pixels adjacent the gap in directions perpendicular to the first direction.

9. The display device of claim 8 wherein each subpixel is shaped substantially in the form of a square oriented at one of 0 degrees and 45 degrees from an axis of the rectilinear matrix of subpixels.

10. A display device comprising a matrix of subpixels grouped into pixels, the matrix of subpixels arranged in a substantially rectilinear matrix oriented at substantially a 45 degree angle relative to a major axis of the display, said pixels comprising pixels formed into "I" shapes slanted at a positive 45 degree slope relative to a major axis of the display and pixels formed into "I" shapes slanted at a negative 45 degree slope relative to the major axis of the display.

11. The display device of claim 10, wherein the pixels are arranged in extended repeating patterns, the pixels adjacent each other along a length of each extended repeating pattern alternating in slant from negative 45 degrees to positive 45 degrees, overlapping only by two subpixels, and forming a snaking pattern along the length of the extended repeating pattern identical in geometry to a pattern of adjacent extended repeating patterns.

12. The display device of claim 11, wherein each subpixel is shaped substantially in the form of a square oriented at one of 0 degrees and 45 degrees from an axis of the rectilinear matrix of subpixels.

13. The display device of claim 11, wherein each pixel comprises three subpixels.

14. The display device of claim 10, wherein the pixels are arranged in extended repeating patterns, the pixels adjacent each other along a length of each extended repeating pattern alternating in slant from negative 45 degrees to positive 45 degrees, overlapping only by two subpixels, and forming a snaking pattern along the length of the extended repeating pattern, wherein for one of each pair of adjacent extended repeating patterns, each pixel meets an adjacent pixel in a first direction within the extended repeating pattern on a longest side of the adjacent pixel, and wherein for the other of each pair of adjacent extended repeating patterns, each pixel meets an adjacent pixel in the first direction within the extended repeating pattern on a shortest side of the adjacent pixel.

15. The display device architecture of claim 14, wherein each subpixel is shaped substantially in the form of a square oriented at one of 0 degrees and 45 degrees from an axis of the rectilinear matrix of subpixels.

16. The display device of claim 14, wherein each pixel comprises three subpixels.

17. A display device comprising a matrix of subpixels grouped into pixels, the matrix of subpixels arranged in a substantially rectilinear matrix oriented at substantially a 45 degree angle relative to a major axis of the display, each pixel having four subpixels and formed into a diamond shape, a first and a second of the four subpixels unshared with neighboring pixels, a third and a fourth subpixel of the four subpixels shared with neighboring pixels.

18. The display device of claim 17, wherein the pixels are arranged in extended repeating patterns, the pixels adjacent each other along a length of each extended repeating pattern overlapping only by two subpixels, forming a snaking pattern the length of the extended repeating pattern identical in geometry to a pattern of adjacent extended repeating patterns, the two subpixels of each pixel in the extended repeating pattern which are closest to the adjacent extended repeating pattern on either side of the extended repeating pattern being shared with respective pixels of the adjacent extended repeating patterns.

19. The display device of claim 18 wherein the unshared subpixels of each pixel comprise a green subpixel and a white subpixel and wherein the shared subpixels of each pixel comprise a red subpixel and a blue subpixel.

20. A display device comprising a matrix of subpixels grouped into pixels, the matrix of subpixels arranged based on a substantially rectilinear matrix oriented at substantially a 45 degree angle relative to a major axis of the display, subsequently skewed either to vertically align subpixels in every third subpixel row or to horizontally align subpixels in every third subpixel column, exhibiting a reduced pixel pitch for the subpixels.

* * * * *